United States Patent
Chen et al.

(10) Patent No.: US 9,153,571 B1
(45) Date of Patent: Oct. 6, 2015

(54) STACKED ELECTROSTATIC DISCHARGE (ESD) PROTECTION DEVICE

(71) Applicant: UNITED MICROELECTRONICS CORPORATION, Hsinchu (TW)

(72) Inventors: Lu-An Chen, Hsinchu (TW); Tien-Hao Tang, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/325,360

(22) Filed: Jul. 7, 2014

(51) Int. Cl.
*H01L 27/02* (2006.01)

(52) U.S. Cl.
CPC .................................. *H01L 27/0266* (2013.01)

(58) Field of Classification Search
CPC ............ H01L 27/0248; H01L 27/0255; H01L 2924/00; H01L 2924/0002; H01L 2914/3011; H01L 27/0266
See application file for complete search history.

(56) References Cited

U.S. PATENT DOCUMENTS

| | | | | |
|---|---|---|---|---|
| 5,920,096 | A * | 7/1999 | Lee | 257/355 |
| 8,963,288 | B2 * | 2/2015 | He et al. | 257/601 |
| 2005/0045909 | A1 * | 3/2005 | Zhang | 257/173 |
| 2014/0197450 | A1 * | 7/2014 | He et al. | 257/133 |

* cited by examiner

*Primary Examiner* — Nikolay Yushin
(74) *Attorney, Agent, or Firm* — Ding Yu Tan

(57) ABSTRACT

A stacked electrostatic discharge (ESD) protection device includes a substrate; a deep well with a first conductive type formed in the substrate, the deep well defining a plurality of element regions with a second conductive type therein; and a plurality of ESD protection elements, each of which is formed in one of the element regions. A current path is formed by connecting the plurality of ESD protection elements in series.

23 Claims, 13 Drawing Sheets

STACKED ELECTROSTATIC DISCHARGE (ESD) PROTECTION DEVICE

FIELD OF THE INVENTION

The present invention relates to a stacked electrostatic discharge (ESD) protection device and, more particularly, to a stacked ESD protection device using a common deep well structure to reduce the layout area for a high density very-large-scale integration (VLSI) circuit.

BACKGROUND OF THE INVENTION

Electrostatic discharge (ESD) is a transient process of high energy transformation from external to internal of an integrated circuit (IC) when the IC is floated. Hundreds or even thousands of volts are transferred during ESD. Such high voltage transformation is a common failure mechanism that is seen on integrated circuit devices. Due to the ever increasing shrinkage in transistor geometries, prevention of ESD damage will become increasingly important.

FIG. 1 is a circuit diagram with ESD protection devices. In FIG. 1, before an input signal is provided into a core circuit 101 via an input pad 102, ESD clamps 104 and 105 are used to bypass an ESD current to the system voltage trace VDD and the ground voltage trace GND, respectively. Similarly, additional ESD clamps 106 and 107 may also be used to bypass an ESD current to the system voltage trace VDD and the ground voltage trace GND, respectively, before an output signal is delivered to the output pad 103. Furthermore, a power clamp 110 may be installed across the VDD and the GND to protect the core circuit 101 against ESD damages.

The grounded-gate n-channel metal-oxide-semiconductor (GGNMOS) transistor has been investigated to serve as an effective ESD protection device. The GGNMOS device is based on snapback mechanism. When the voltage reaches a level beyond the IC normal operation due to ESD zapping, the snapback mechanism enables the GGNMOS to conduct a high level ESD current between its drain and source and subsequently directs the ESD current into the ground. While the ESD zapping occurs, some elementary transistors may firstly turn on, and immediately breakdown with the onset of secondary snapback and the other elementary transistors may be inactive to contribute to the ESD protection. Such phenomenon is referred to as "latch-up".

The holding voltage of these high-voltage devices in snapback breakdown condition has been found to be much smaller than the power supply voltage. Such characteristics will cause the ICs to be susceptible to the latch-up-like danger in the practical system applications, especially when these devices are used in the ESD power clamp circuit (such as the power clamp 110 of FIG. 1).

Recently, some people have reported to use stacked structures in power clamps. For example, in *Proc. EOS/ESD Symposium* 2004, Lin et al. have published a new latch up-free design on the power-rail ESD clamp circuit with stacked-field-oxide structure proposed and successfully verified in a 0.25-μm 40-V CMOS process to achieve the desired ESD level. The total holding voltage of the stacked-field-oxide structure in snapback breakdown condition can be larger than the power supply voltage. Therefore, latch-up or latch-up-like issues can be avoided by stacked-field-oxide structures for the IC applications with a power supply of 40 V.

FIG. 2 shows another example of a stacked ESD protection device 200. In FIG. 2, the stacked ESD protection device 200 comprises a p-type substrate 201 and a plurality of high-voltage deep n-wells (HVDNWs) 202 formed in the p-type substrate 201. Each of the HVDNWs 202 is isolated from one another. A p-well as an element region 203 is formed in each of the HVDNWs 202. In each element region 203, a pair of separated highly doped n$^+$ regions 205 are formed as drain/source regions. A dielectric layer (not shown) is formed on a channel region between the drain/source regions 205. A conductor 207 as a gate electrode is formed on the dielectric layer. Therefore, an n-channel MOS field-effect transistor (NMOSFET) is formed. Furthermore, a highly doped p$^+$ region 206 in a p-well 204 is provided to connect the p-type substrate 201 to the ground GND. Accordingly, an ESD protection device with stacked NMOSFETs is completed by conducting a current path to connect the NMOSFET ESD protection elements in series.

It is noted that the stacked ESD protection device 200 shown in FIG. 2 with the isolated HVDNWs 202 requires a large layout area. Therefore, there is need in providing a layout area shrink design for high density very-large-scale integration (VLSI) applications.

SUMMARY OF THE INVENTION

It is one object of the present invention to provide a stacked ESD protection device with a common deep well structure to increase the holding voltage to avoid the latch-up issues.

It is another object of the present invention to provide a stacked ESD protection device with a common deep well structure to reduce the layout area for high density very-large-scale integration (VLSI) applications.

To achieve the foregoing objects, the present invention provides a stacked electrostatic discharge (ESD) protection device, comprising: a substrate; a deep well with a first conductive type formed in the substrate, the deep well defining a plurality of element regions with a second conductive type therein; and a plurality of ESD protection elements, each being formed in one of the element regions; wherein a current path is formed by connecting the plurality of ESD protection elements in series.

Alternatively, the present invention provides a stacked electrostatic discharge (ESD) protection device, comprising: a substrate; an epitaxial layer with a first conductive type formed on the substrate; a deep well with a second conductive type formed in the epitaxial layer, the deep well defining a plurality of element regions with a first conductive type therein; and a plurality of ESD protection elements, each being formed in one of the element regions; wherein a current path is formed by connecting the plurality of ESD protection elements in series.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
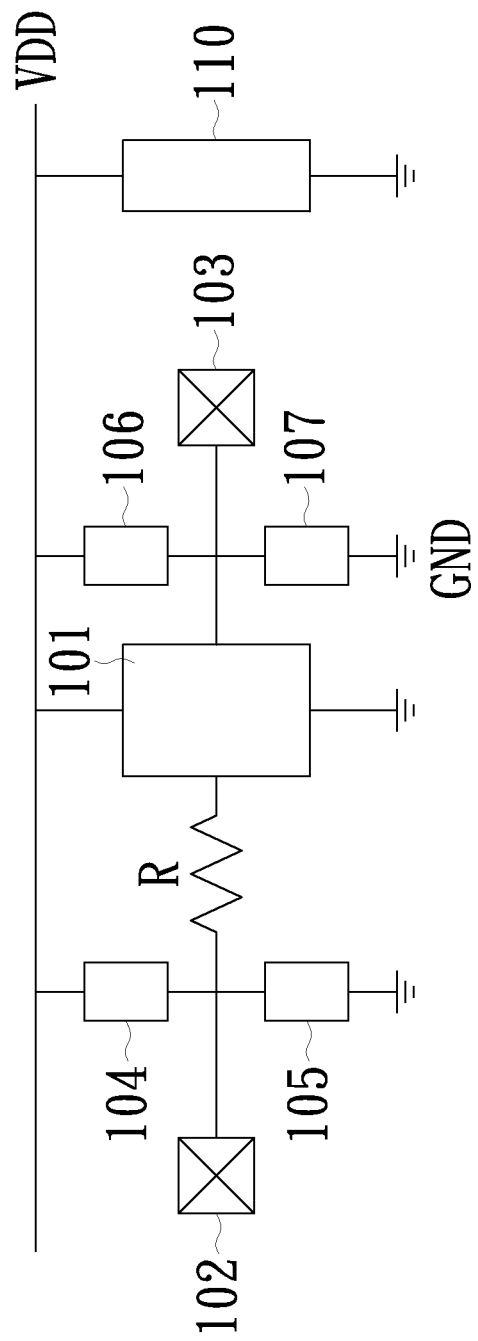
FIG. 1 is a circuit diagram of conventional ESD protection devices.
Figure 2:
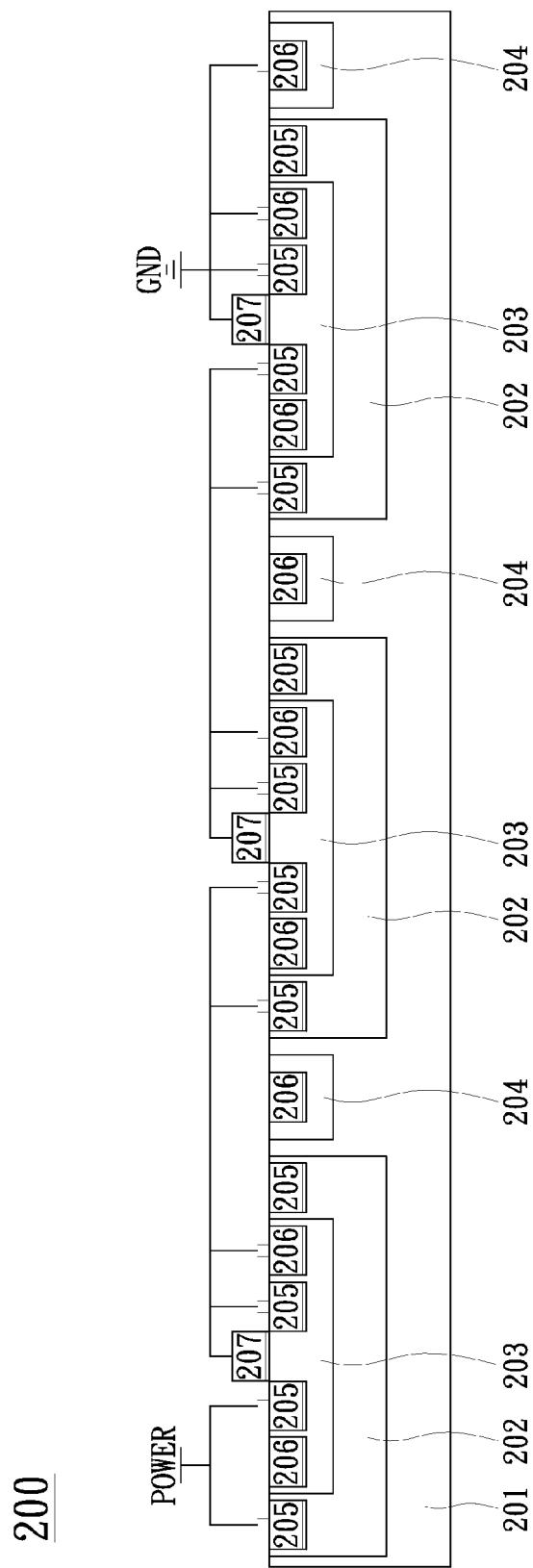
FIG. 2 is a cross-sectional view of a conventional stacked ESD protection device.
Figure 3:
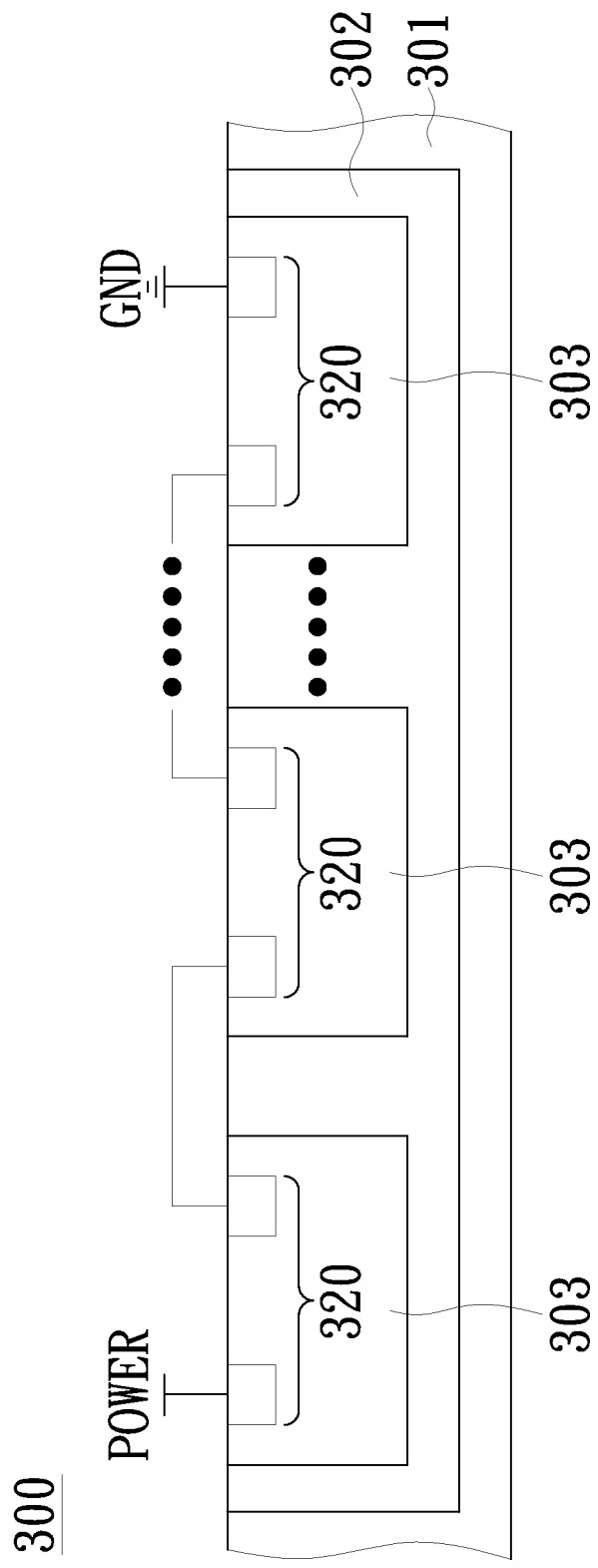
FIG. 3 is a cross-sectional view of a stacked ESD protection device of the present invention.

FIG. 3 is a cross-sectional view of a stacked ESD protection device of the present invention. The stacked electrostatic discharge (ESD) protection device 300 comprises: a substrate 301; a deep well 302 with a first conductive type formed in the substrate 301, the deep well 302 defining a plurality of element regions 303 with a second conductive type therein; and a plurality of ESD protection elements 320, in which each ESD protection element 320 is formed in one of the element regions 303. Accordingly, an ESD protection device with stacked ESD protection elements 320 in the common deep well 302 is completed by forming a current path to connect the ESD protection elements 320 in series.

Figure 4:
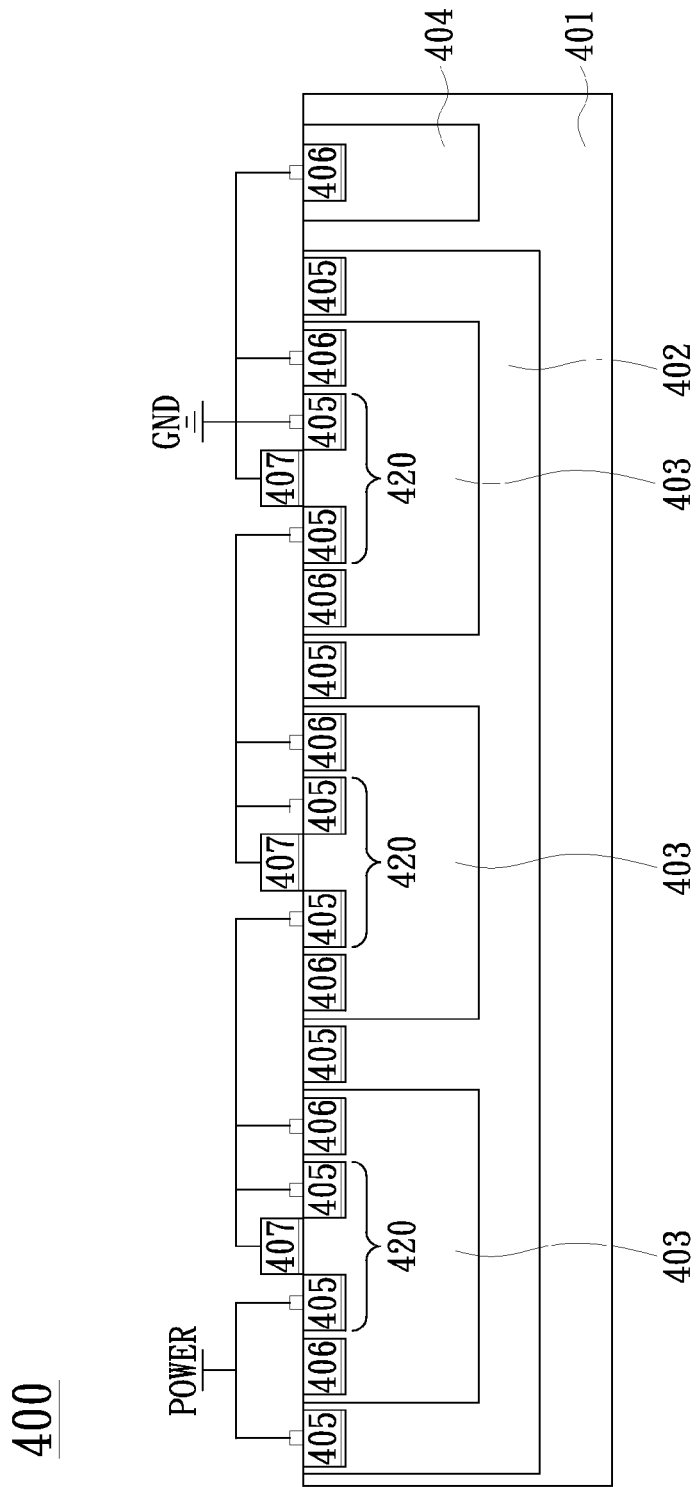
FIG. 4 is a cross-sectional view of a stacked ESD protection device according to one embodiment of the present invention.

Preferably, in one embodiment, as shown in FIG. 4, which is a cross-sectional view of a stacked ESD protection device according to one embodiment of the present invention, the stacked electrostatic discharge (ESD) protection device 400 comprises: a p-type substrate 401; a deep n-well 402 formed in the p-type substrate 401, the deep n-well 402 defining a plurality of p-wells as being a plurality of element regions 403; and a plurality of ESD protection elements 420, each of which is formed in one of the element regions 403.

Preferably, each of the plurality of ESD protection elements 420 comprises: a pair of separated highly doped n$^+$ regions 405 as a plurality of drain/source regions; a dielectric layer (not shown) formed on a channel region between the drain/source regions which are the pair of the highly doped n+ regions 405; and a conductor 407 as a gate electrode formed on the dielectric layer. Therefore, an n-channel MOS field-effect transistor (NMOSFET) 420 is formed. Furthermore, one highly doped p$^+$ region 406 in a p-well 404 is provided to connect the p-type substrate 401 to the ground GND. Accordingly, an ESD protection device with stacked NMOSFETs 420 in a common deep n-well 402 is completed by forming a current path to connect the NMOSFET ESD protection elements 420 in series.

Preferably, the doping level of the highly doped n$^+$ regions 405 is higher than that of the deep n-well 402. The depth of the deep n-well 402 is larger than that of the element regions 403 and the depth of the element regions 403 is larger than that of the highly doped n$^+$ regions 405.

Figure 5:
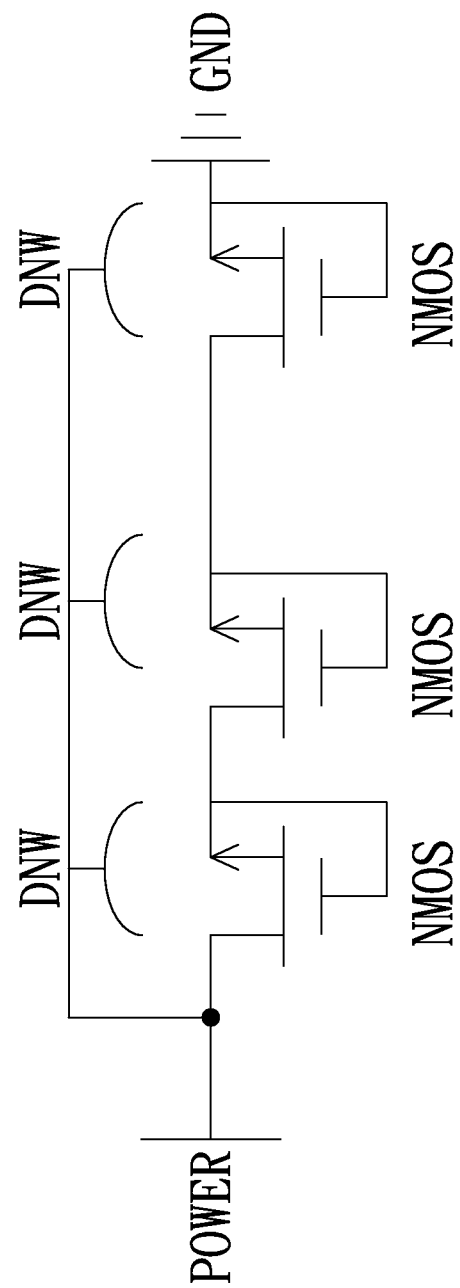
FIG. 5 is a circuit diagram of a stacked ESD protection device of FIG. 4.

Preferably, FIG. 5 is a circuit diagram of the stacked ESD protection device of FIG. 4. It is noted that the present embodiment is only exemplified by, but not limited to, three NMOSFETs 420 disposed in a common deep n-well 402. Various modifications and similar arrangements made by persons with ordinary skills in the art are still within the scope of the present invention.

Figure 6:
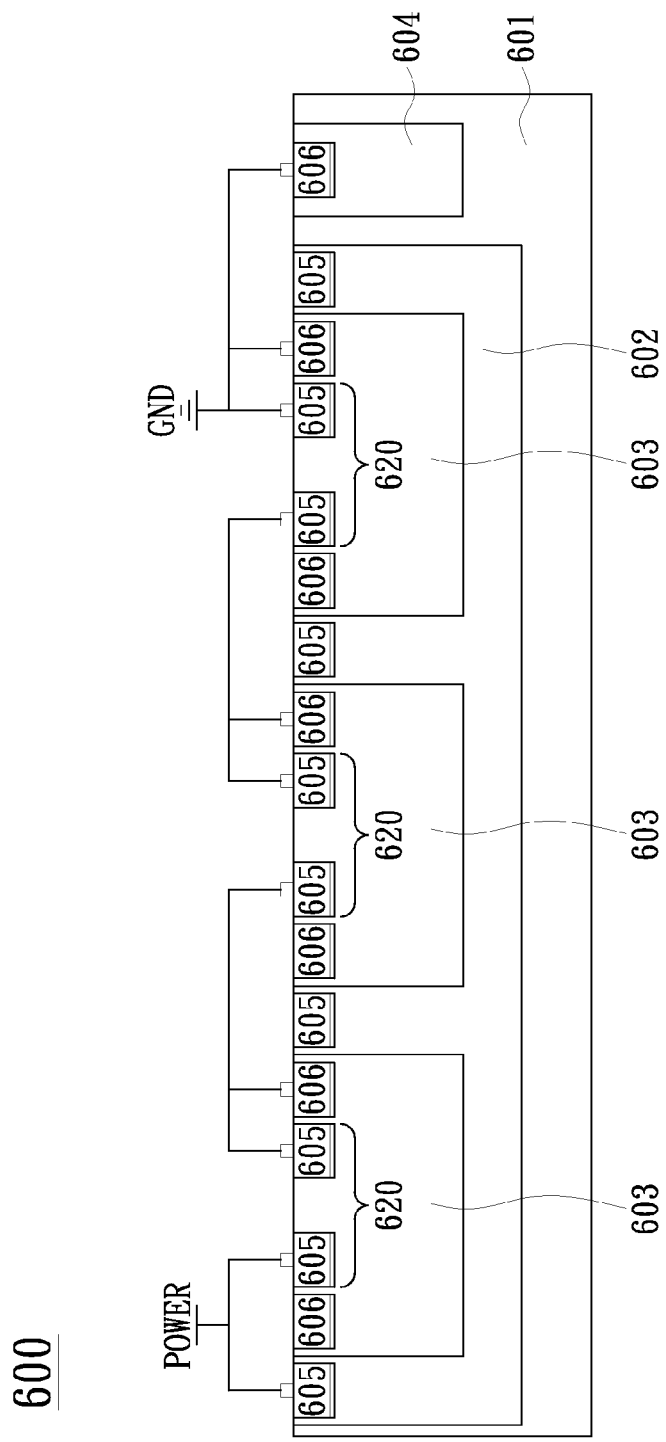
FIG. 6 is a cross-sectional view of a stacked ESD protection device according to another embodiment of the present invention.

Preferably, in one embodiment, as shown in FIG. 6, which is a cross-sectional view of a stacked ESD protection device according to another embodiment of the present invention, the stacked electrostatic discharge (ESD) protection device 600 comprises: a p-type substrate 601; a deep n-well 602 formed in the p-type substrate 601, the deep n-well 602 defining a plurality of p-wells as being a plurality of element regions 603; and a plurality of ESD protection elements 620, each of which is formed in one of the element regions 603.

Preferably, each of the plurality of ESD protection elements 620 comprises: a pair of separated highly doped n$^+$ regions 605 as collector/emitter regions. Therefore, an npn bipolar junction transistor (NPNBJT) 620 is formed. Furthermore, one highly doped p$^+$ region 606 in a p-well 604 is provided to connect the p-type substrate 601 to the ground GND. Accordingly, an ESD protection device with stacked NPNBJTs 620 in a common deep n-well 602 is completed by forming a current path to connect the NPNBJT ESD protection elements 620 in series.

Preferably, the doping level of the highly doped n$^+$ regions 605 is higher than that of the deep n-well 602. The depth of the n-well 602 is larger than that of the element regions 603 and the depth of the element regions 603 is larger than that of the highly doped n$^+$ regions 605. Preferably, each of the plurality of ESD protection elements 620 further comprises an isolation structure (not shown) between the collector/emitter regions, which are the highly doped n$^+$ regions 605. For example, the isolation structure may be implemented using a shallow trench isolator (STI), a field oxide (FOX), a local oxidation of silicon (LOCOS) structure and the like.

Figure 7:
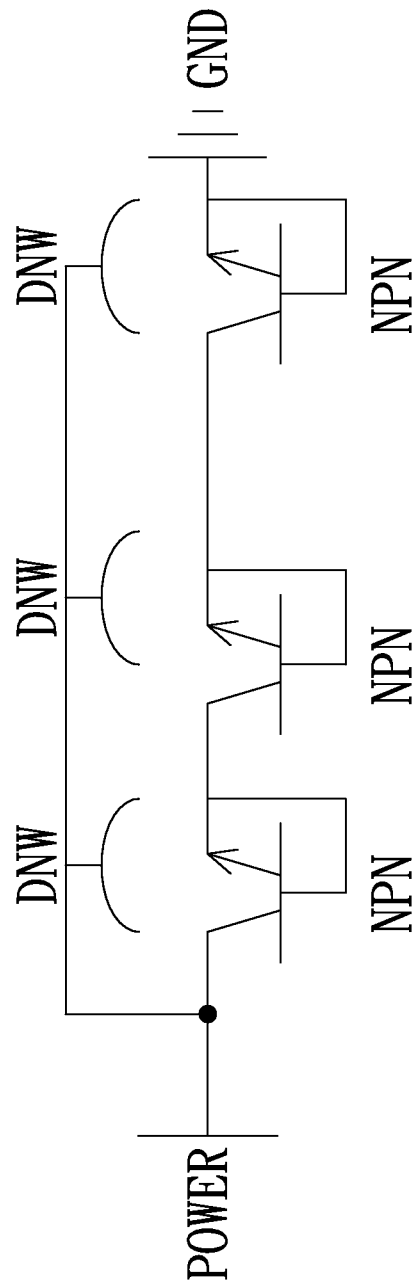
FIG. 7 is a circuit diagram of a stacked ESD protection device of FIG. 6.

Preferably, FIG. 7 is a circuit diagram of the stacked ESD protection device of FIG. 6. It is noted that the present embodiment is only exemplified by, but not limited to, three NPNBJTs 620 in a common deep n-well 602. Various modifications and similar arrangements made by persons with ordinary skills in the art are still within the scope of the present invention.

Figure 8:
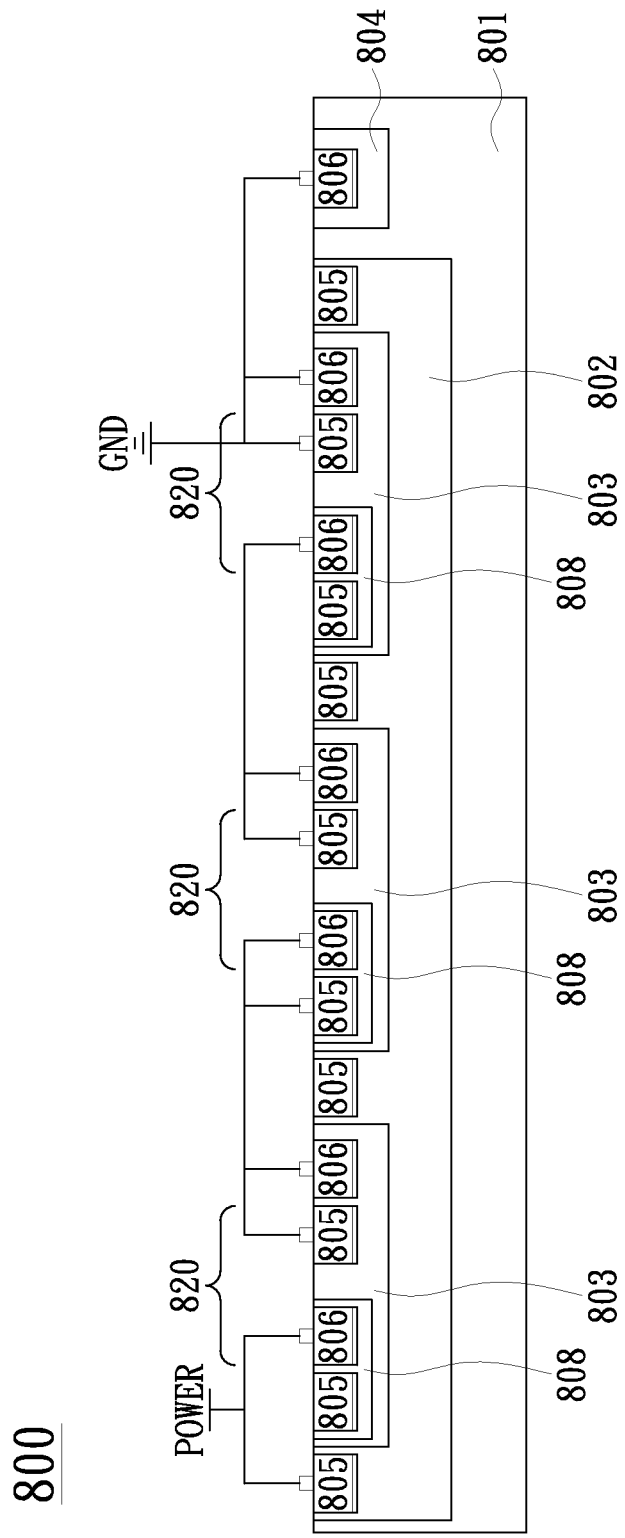
FIG. 8 is a cross-sectional view of a stacked ESD protection device according to still another embodiment of the present invention.

Preferably, in one embodiment, as shown in FIG. 8, which is a cross-sectional view of a stacked ESD protection device according to still another embodiment of the present invention, the stacked electrostatic discharge (ESD) protection device 800 comprises: a p-type substrate 801; a deep n-well 802 formed in the p-type substrate 801, the deep n-well 802 defining a plurality of p-wells as a plurality of element regions 803; and a plurality of ESD protection elements 820, each of which is formed in one of the element regions 803.

Preferably, each of the plurality of ESD protection elements 820 comprises: a shallow n-well 808 formed in one of the p-type element regions 803; a highly doped n$^+$ region 805 formed in the p-type element region 803; and a highly doped p$^+$ region 806 formed in the shallow n-well 808. The current path flows from the highly doped p$^+$ region 806 formed in the shallow n-well 808 to the highly doped n$^+$ region 805 formed in the p-type element region 803. Therefore, a pnpn silicon-controlled rectifier (SCR) 820 is formed. Furthermore, one highly doped p$^+$ region 806 in a p-well 804 is provided to connect the p-type substrate 801 to the ground GND. Accordingly, an ESD protection device with stacked SCRs 820 in a common deep n-well 802 is completed by forming a current path to connect the SCR ESD protection elements 820 in series.

Preferably, the doping level of the highly doped n$^+$ region 805 is higher than that of the shallow n-well 808, the doping level of the shallow n-well 808 is higher than that of the deep n-well 802 and the doping level of the highly doped p$^+$ region 806 is higher than that of the p-type element regions 803. The depth of the deep n-well 802 is larger than that of the p-type element regions 803, the depth of the p-type element regions 803 is larger than that of the shallow n-well 808, the depth of the shallow n-well 808 is larger than that of the highly doped n$^+$ region 805 and the highly doped p$^+$ region 806, respectively.

Figure 9:
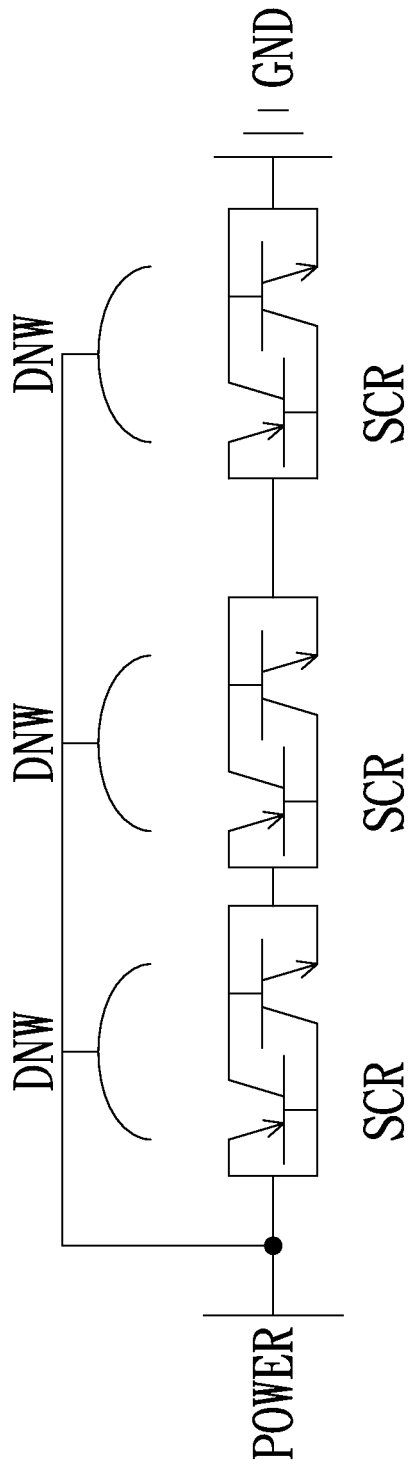
FIG. 9 is a circuit diagram of a stacked ESD protection device of FIG. 8.

Preferably, FIG. 9 is a circuit diagram of the stacked ESD protection device of FIG. 8. It is noted that the present embodiment is only exemplified by, but not limited to, three SCRs 820 disposed in a common deep n-well 802. Various modifications and similar arrangements made by persons with ordinary skills in the art are still within the scope of the present invention.

Figure 10:
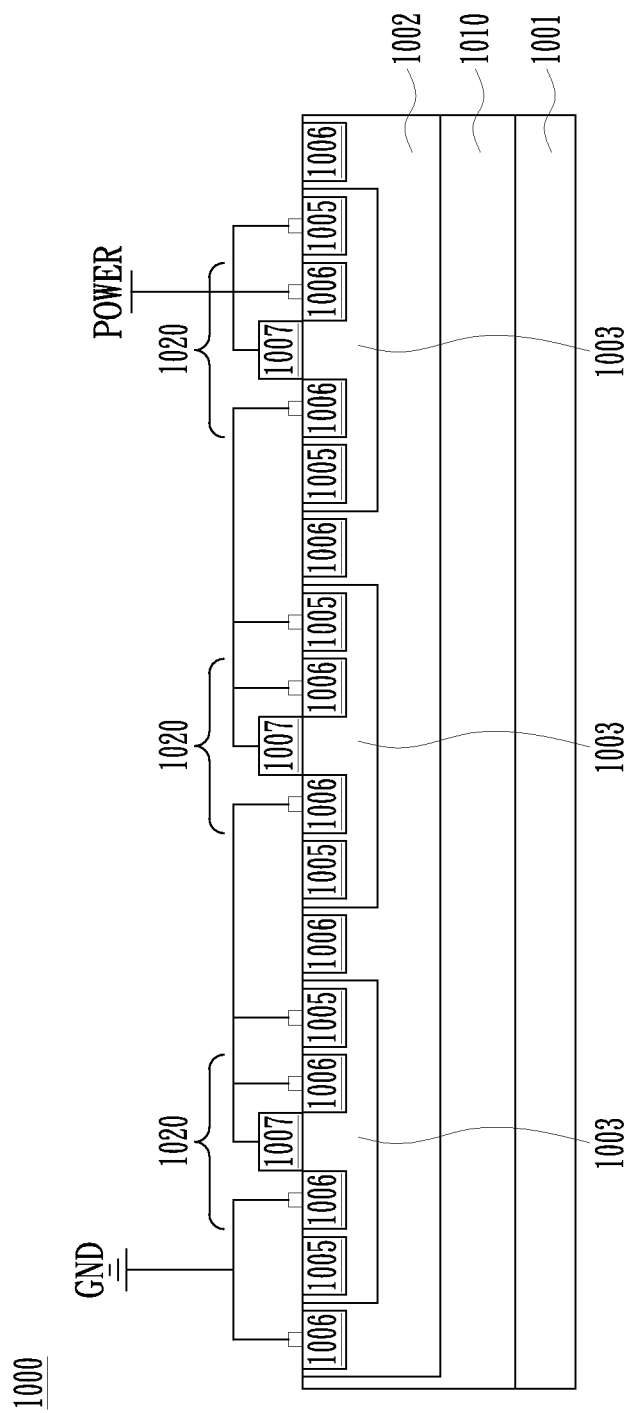
FIG. 10 is a cross-sectional view of a stacked ESD protection device according to yet another embodiment of the present invention.

Preferably, in one embodiment, as shown in FIG. 10, which is a cross-sectional view of a stacked ESD protection device according to yet another embodiment of the present invention, the stacked electrostatic discharge (ESD) protection device 1000 comprises: a p-type substrate 1001; an n-type epitaxial layer 1010 formed on the substrate 1001; a deep p-well 1002 formed in the n-type epitaxial layer 1010, the deep p-well 1002 defining a plurality of n-wells as a plurality of element regions 1003; and a plurality of ESD protection elements 1020, each being formed in one of the element regions 1003.

Preferably, each of the plurality of ESD protection elements 1020 comprises: a pair of separated highly doped p$^+$ regions 1006 as drain/source regions; a dielectric layer (not shown) formed on a channel region between the drain/source regions which are the highly doped p$^+$ regions 1006; and a conductor 1007 as a gate electrode formed on the dielectric layer. Therefore, a p-channel MOS field-effect transistor (PMOSFET) 1020 is formed. Furthermore, one highly doped p$^+$ region 1006 in the deep p-well 1002 is provided to connect the deep p-well 1002 to the ground GND. Accordingly, an ESD protection device with stacked PMOSFETs 1020 in a common deep p-well 1002 is completed by forming a current path to connect the PMOSFET ESD protection elements 1020 in series.

Preferably, the doping level of the highly doped p$^+$ regions 1006 is higher than that of the deep p-well 1002, and the doping level of the n-type element regions 1003 is higher than that of the n-type epitaxial layer 1010. The depth of the n-type epitaxial layer 1010 is larger than that of the deep p-well 1002; the depth of the deep p-well 1002 is larger than that of the n-type element regions 1003; and the depth of the n-type element regions 1003 is larger than that of the highly doped p$^+$ regions 1006.

Figure 11:
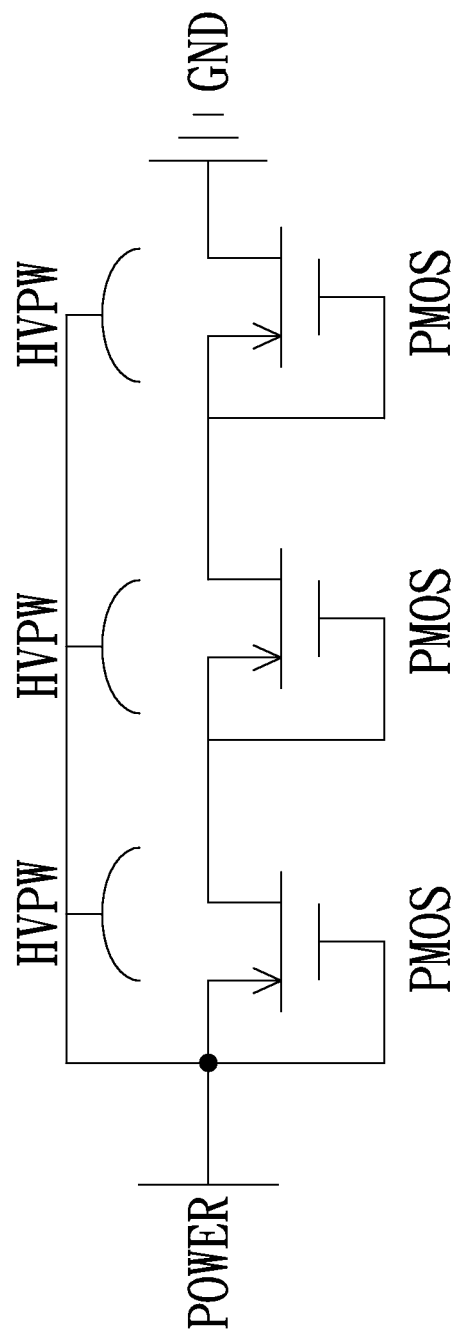
FIG. 11 is a circuit diagram of a stacked ESD protection device of FIG. 10.

Preferably, FIG. 11 is a circuit diagram of the stacked ESD protection device of FIG. 10. It is noted that the present embodiment is only exemplified by, but not limited to, three PMOSFETs 1020 in a common deep p-well 1002. Various modifications and similar arrangements made by persons with ordinary skills in the art are still within the scope of the present invention.

Figure 12:
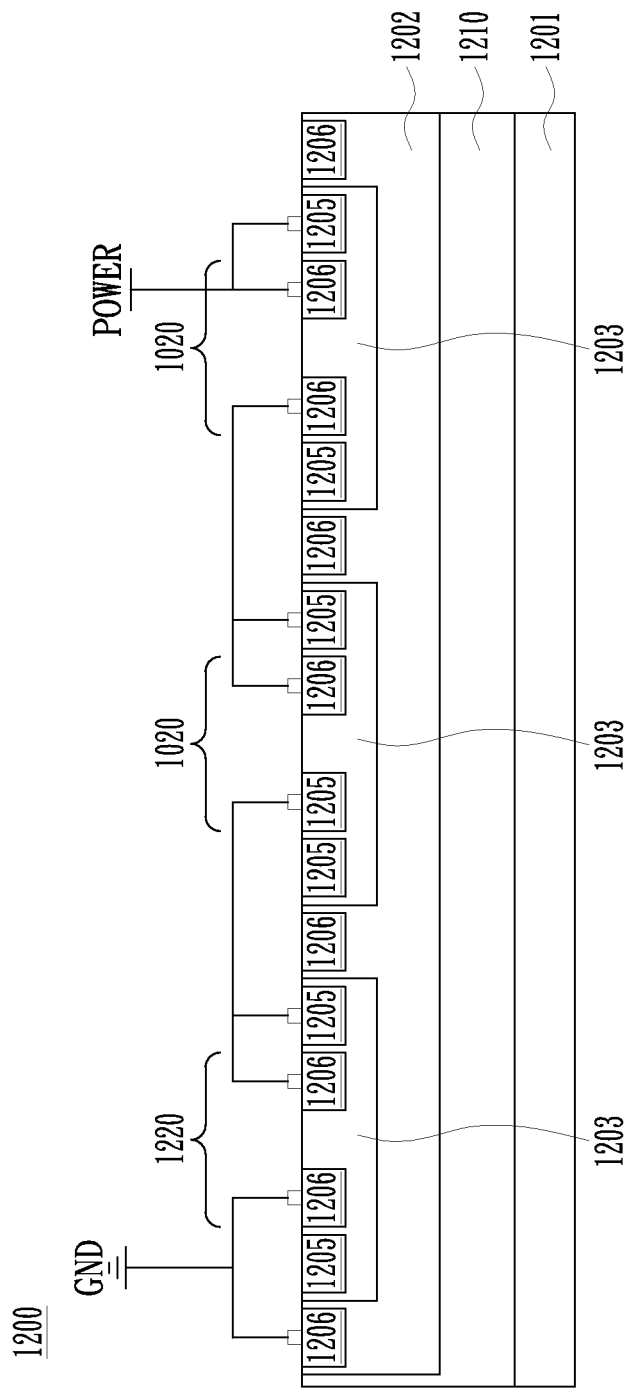
FIG. 12 is a cross-sectional view of a stacked ESD protection device according to yet another embodiment of the present invention.

Preferably, in one embodiment, as shown in FIG. 12, which is a cross-sectional view of a stacked ESD protection device according to another embodiment of the present invention, the stacked electrostatic discharge (ESD) protection device 1200 comprises: a p-type substrate 1201; an n-type epitaxial layer 1210 formed on the substrate 1201; a deep p-well 1202 formed in the n-type epitaxial layer 1210, the deep p-well 1202 defining a plurality of n-wells as a plurality of element regions 1203; and a plurality of ESD protection elements 1220, each being formed in one of the element regions 1003.

Preferably, each of the plurality of ESD protection elements 1220 comprises: a pair of separated highly doped p$^+$ regions 1206 as collector/emitter regions. Therefore, a pnp bipolar junction transistor (PNPBJT) 1220 is formed. Furthermore, one highly doped p$^+$ region 1206 in the deep p-well 1202 is provided to connect the deep p-well 1202 to the ground GND. Accordingly, an ESD protection device with stacked PNPBJT's 1220 in a common deep p-well 1202 is completed by forming a current path to connect the PNPBJT ESD protection elements 1220 in series.

Preferably, the doping level of the highly doped p$^+$ regions 1206 is higher than that of the deep p-well 1202, and the doping level of the n-type element regions 1203 is higher than that of the n-type epitaxial layer 1210. The depth of the n-type epitaxial layer 1210 is larger than that of the deep p-well 1202, the depth of the deep p-well 1202 is larger than that of the n-type element regions 1203 and the depth of the n-type element regions 1203 is larger than that of the highly doped p$^+$ regions 1206. Preferably, each of the plurality of ESD protection elements 1220 further comprises an isolation structure (not shown) between highly doped p$^+$ regions (the collector/emitter regions) 1206. For example, the isolation structure may be implemented using a shallow trench isolator (STI), a field oxide (FOX), a local oxidation of silicon (LOCOS) structure and the like.

Figure 13:
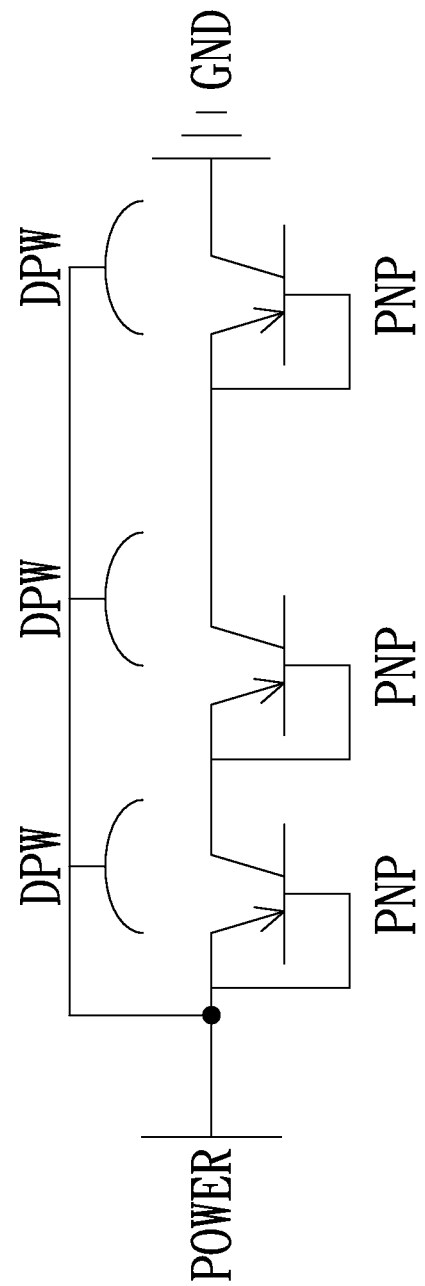
FIG. 13 is a circuit diagram of a stacked ESD protection device of FIG. 12.

Preferably, FIG. 13 is a circuit diagram of the stacked ESD protection device of FIG. 12. It is noted that the present embodiment is only exemplified by, but not limited to, three PNPBJTs 1220 in a common deep p-well 1202. Various modifications and similar arrangements made by persons with ordinary skills in the art are still within the scope of the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A stacked electrostatic discharge (ESD) protection device, comprising:
    a substrate;
    a deep well with a first conductive type formed in said substrate, said deep well defining a plurality of element regions with a second conductive type therein; and
    a plurality of ESD protection elements, each of said ESD protection elements being formed in one of said element regions;
    a pair of separated highly doped regions with said first conductive type;
    a dielectric layer formed on a channel region between said pair of separated highly doped regions; and
    a conductor formed on said dielectric layer;
    wherein a current path is formed by connecting said plurality of ESD protection elements in series.

2. The stacked electrostatic discharge (ESD) protection device according to claim 1, wherein the doping level of said highly doped regions is higher than that of said deep well.

3. The stacked electrostatic discharge (ESD) protection device according to claim 1, wherein the depth of said deep well is larger than that of said element regions, and the depth of said element regions is larger than that of said highly doped regions.

4. A stacked electrostatic discharge (ESD) protection device, comprising:
a substrate;
a deep well with a first conductive type formed in said substrate, said deep well defining a plurality of element regions with a second conductive type therein; and
a plurality of ESD protection elements, each of said ESD protection elements being formed in one of said element regions;
a pair of separated highly doped regions with said first conductive type;
wherein a current path is formed by connecting said plurality of ESD protection elements in series.

5. The stacked electrostatic discharge (ESD) protection device according to claim 4, wherein the doping level of said highly doped regions is higher than that of said deep well.

6. The stacked electrostatic discharge (ESD) protection device according to claim 4, wherein the depth of said deep well is larger than that of said element regions and the depth of said element regions is larger than that of said highly doped regions.

7. The stacked electrostatic discharge (ESD) protection device according to claim 4, further comprising an isolation structure between said pair of separated highly doped regions.

8. The stacked electrostatic discharge (ESD) protection device according to claim 7, wherein the doping level of said highly doped regions is higher than that of said deep well.

9. The stacked electrostatic discharge (ESD) protection device according to claim 7, wherein the depth of said deep well is larger than that of said element regions and the depth of said element regions is larger than that of said highly doped regions.

10. The stacked electrostatic discharge (ESD) protection device according to claim 7, wherein said isolation structure is a shallow trench isolator (STI), a field oxide (FOX) or a local oxidation of silicon (LOCOS) structure.

11. A stacked electrostatic discharge (ESD) protection device, comprising:
a substrate;
a deep well with a first conductive type formed in said substrate, said deep well defining a plurality of element regions with a second conductive type therein; and
a plurality of ESD protection elements, each of said ESD protection elements being formed in one of said element regions;
a shallow well with said first conductive type formed in one of said element regions;
a first highly doped region with said first conductive type formed surrounded directly by said element region with said second conductive type; and
a second highly doped region with said second conductive type formed in said shallow well with said first conductive type;
wherein a current path is formed by connecting said plurality of ESD protection elements in series said current path flows from said second highly doped region with said second conductive type formed in said element region with said second conductive type to said first highly doped region with said first conductive type formed surrounded directly by said element region with said second conductive type.

12. The stacked electrostatic discharge (ESD) protection device according to claim 11, wherein the doping level of said first highly doped region is higher than that of said shallow well, the doping level of said shallow well is higher than that of said deep well and the doping level of said second highly doped region is higher than that of said element region.

13. The stacked electrostatic discharge (ESD) protection device according to claim 11, wherein the depth of said deep well is larger than that of said element region, the depth of said element region is larger than that of said shallow well, the depth of said shallow well is larger than that of said first highly doped region and said second highly doped region, respectively.

14. A stacked electrostatic discharge (ESD) protection device, comprising:
a substrate;
an epitaxial layer with a first conductive type formed on said substrate;
a deep well with a second conductive type formed in said epitaxial layer, said deep well defining a plurality of element regions with a first conductive type therein; and
a plurality of ESD protection elements, each of said plurality of ESD protection elements being formed in one of said element regions;
a pair of separated highly doped regions with said second conductive type;
a dielectric layer formed on a channel region between said pair of separated highly doped regions; and
a conductor formed on said dielectric layer;
wherein a current path is formed by connecting said plurality of ESD protection elements in series.

15. The stacked electrostatic discharge (ESD) protection device according to claim 14, wherein the doping level of said highly doped regions is higher than that of said deep well, and the doping level of said element regions is higher than that of said epitaxial layer.

16. The stacked electrostatic discharge (ESD) protection device according to claim 14, wherein the depth of said epitaxial layer is larger than that of said deep well, the depth of said deep well is larger than that of said element regions and the depth of said element regions is larger than that of said highly doped regions.

17. A stacked electrostatic discharge (ESD) protection device, comprising:
a substrate;
an epitaxial layer with a first conductive type formed on said substrate;
a deep well with a second conductive type formed in said epitaxial layer, said deep well defining a plurality of element regions with a first conductive type therein; and
a plurality of ESD protection elements, each of said plurality of ESD protection elements being formed in one of said element regions;
a pair of separated highly doped regions with said second conductive type;
wherein a current path is formed by connecting said plurality of ESD protection elements in series.

18. The stacked electrostatic discharge (ESD) protection device according to claim 17, wherein the doping level of said highly doped regions is higher than that of said deep well, and the doping level of said element regions is higher than that of said epitaxial layer.

19. The stacked electrostatic discharge (ESD) protection device according to claim 17, wherein the depth of said epitaxial layer is larger than that of said deep well, the depth of said deep well is larger than that of said element regions and the depth of said element regions is larger than that of said highly doped regions.

20. The stacked electrostatic discharge (ESD) protection device according to claim 17, further comprising an isolation structure between said pair of separated highly doped regions.

21. The stacked electrostatic discharge (ESD) protection device according to claim 20, wherein the doping level of said highly doped regions is higher than that of said deep well, and the doping level of said element regions is higher than that of said epitaxial layer.

22. The stacked electrostatic discharge (ESD) protection device according to claim 20, wherein the depth of said epitaxial layer is larger than that of said deep well, the depth of said deep well is larger than that of said element regions and the depth of said element regions is larger than that of said highly doped regions.

23. The stacked electrostatic discharge (ESD) protection device according to claim 20, wherein said isolation structure is a shallow trench isolator (STI), a field oxide (FOX) or a local oxidation of silicon (LOCOS) structure.

\* \* \* \* \*